(12) United States Patent
Maruyama

(10) Patent No.: US 9,252,086 B2
(45) Date of Patent: Feb. 2, 2016

(54) CONNECTOR AND RESIN-SEALED SEMICONDUCTOR DEVICE

(71) Applicant: FUJI ELECTRIC CO., LTD, Kawasaki-shi, Kanagawa-ken (JP)

(72) Inventor: Atsushi Maruyama, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 150 days.

(21) Appl. No.: 13/706,699

(22) Filed: Dec. 6, 2012

(65) Prior Publication Data

US 2013/0181334 A1    Jul. 18, 2013

(30) Foreign Application Priority Data

Jan. 12, 2012    (JP) ................................. 2012-003843

(51) Int. Cl.
*H01L 23/495*    (2006.01)
*H01L 21/02*    (2006.01)
(Continued)

(52) U.S. Cl.
CPC .............. *H01L 23/495* (2013.01); *H01L 21/02* (2013.01); *H01L 23/49524* (2013.01); *H01L 23/49562* (2013.01); *H01L 23/49575* (2013.01); *H01L 24/37* (2013.01); *H01L 24/40* (2013.01); *H01L 24/41* (2013.01); *H01L 24/97* (2013.01); *H01L 23/3107* (2013.01); *H01L 2224/3701* (2013.01); *H01L 2224/37012* (2013.01); *H01L 2224/40095* (2013.01); *H01L 2224/40247* (2013.01); *H01L 2224/40249* (2013.01); *H01L 2224/40257* (2013.01); *H01L 2224/41109* (2013.01);
(Continued)

(58) Field of Classification Search
CPC . H01L 23/495; H01L 23/49575; H01L 21/02; H01L 24/41; H01L 23/49524; H01L 23/49562; H01L 24/97; H01L 24/37; H01L 24/40; H01L 2924/1305; H01L 2224/40095; H01L 2924/00014; H01L 2224/40249; H01L 2224/41109; H01L 2224/40257; H01L 2224/3701; H01L 23/310751
USPC ......... 257/676, 774, 773, 698, 693, 692, 691, 257/696; 439/55; 83/862
See application file for complete search history.

(56) References Cited

U.S. PATENT DOCUMENTS

2002/0033541 A1* 3/2002 Uchida .......................... 257/784
2002/0163071 A1* 11/2002 Martin .......................... 257/692
(Continued)

FOREIGN PATENT DOCUMENTS

JP    07-H030050 A    1/1995
JP    2000-036558 A    2/2000
(Continued)

OTHER PUBLICATIONS

Japan Patent Office, "Office Action for JP2012-003843," Oct. 27, 2015.

*Primary Examiner* — Alexander Oscar Williams
(74) *Attorney, Agent, or Firm* — Manabu Kanesaka

(57) ABSTRACT

A connector for electrically connecting a chip electrode of a semiconductor element to a lead constituting an external leading terminal of the chip electrode, includes a first connecting part having an interface joined to the chip electrode; a second connecting part having an interface joined to a base end part of the lead; and a plate-shape coupling part for connecting the first connecting part and the second connecting part to each other, and having a step formed on the interface of the first connecting part in a direction away from the chip electrode by a half blanking process.

14 Claims, 4 Drawing Sheets

(51) Int. Cl.
*H01L 23/00* (2006.01)
*H01L 23/31* (2006.01)

(52) U.S. Cl.
CPC ............... *H01L2224/45124* (2013.01); *H01L 2924/00014* (2013.01); *H01L 2924/1305* (2013.01); *H01L 2924/13055* (2013.01); *H01L 2924/13091* (2013.01); *Y10T 83/0207* (2015.04)

(56) References Cited

U.S. PATENT DOCUMENTS

| | | | |
|---|---|---|---|
| 2007/0172980 A1* | 7/2007 | Tanaka et al. | 438/106 |
| 2007/0228534 A1* | 10/2007 | Uno et al. | 257/678 |
| 2009/0053908 A1* | 2/2009 | Hougham et al. | 439/66 |
| 2009/0084583 A1* | 4/2009 | Ueno | 174/254 |
| 2010/0187678 A1* | 7/2010 | Kajiwara et al. | 257/692 |
| 2010/0308457 A1* | 12/2010 | Ishii | 257/737 |
| 2011/0227205 A1 | 9/2011 | Lu et al. | |
| 2013/0087901 A1* | 4/2013 | Lee et al. | 257/676 |
| 2014/0042609 A1* | 2/2014 | Nagaune | 257/692 |
| 2014/0154843 A1* | 6/2014 | Liu et al. | 438/123 |

FOREIGN PATENT DOCUMENTS

| | | |
|---|---|---|
| JP | 2002-009217 A | 1/2002 |
| JP | 2009-044107 A | 2/2009 |
| JP | 2009-259981 A | 11/2009 |
| JP | 2009-267054 A | 11/2009 |

* cited by examiner

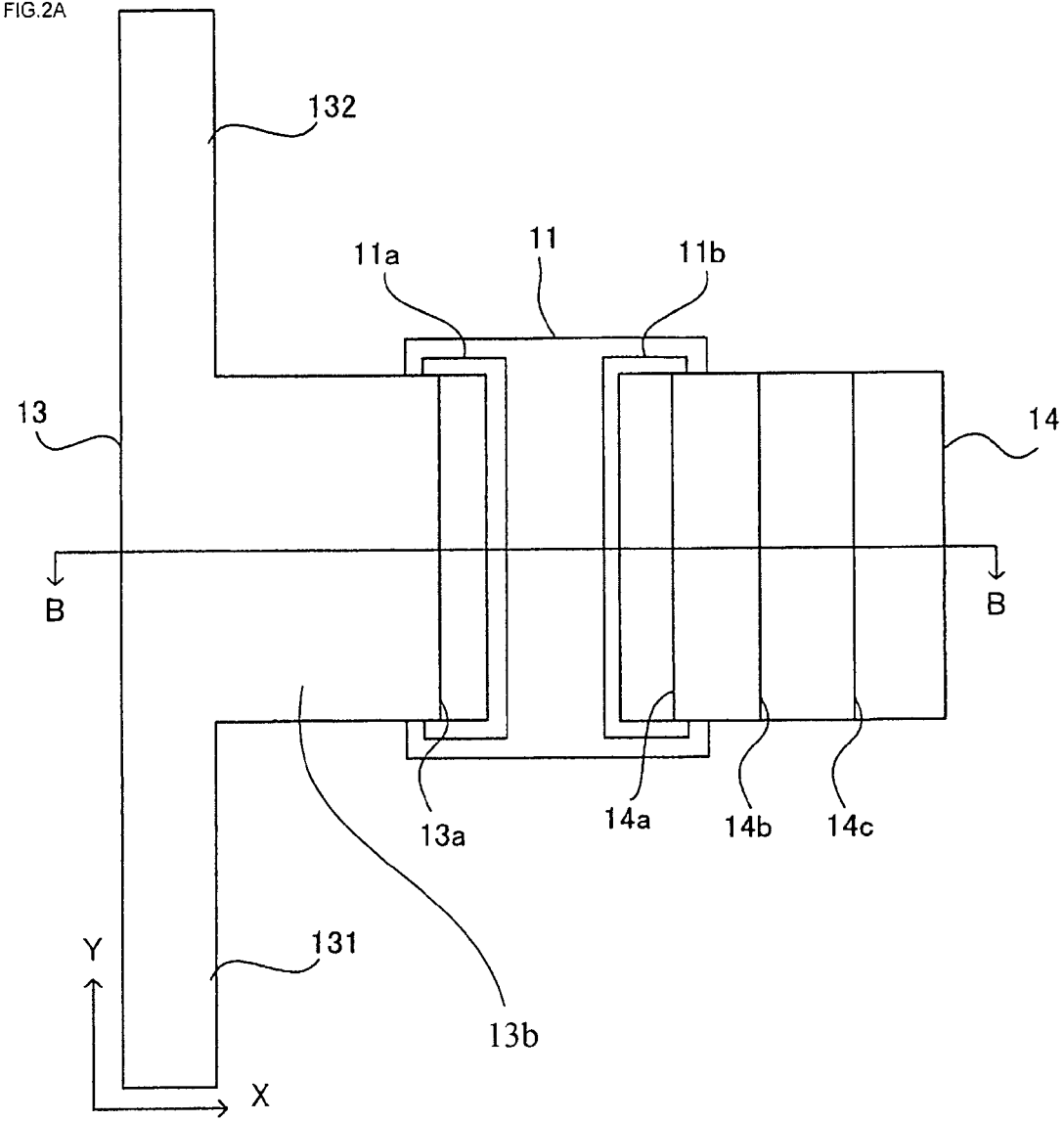
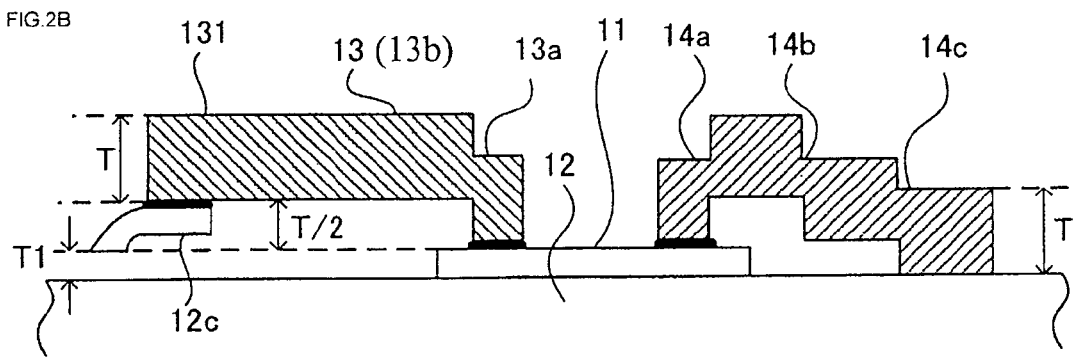

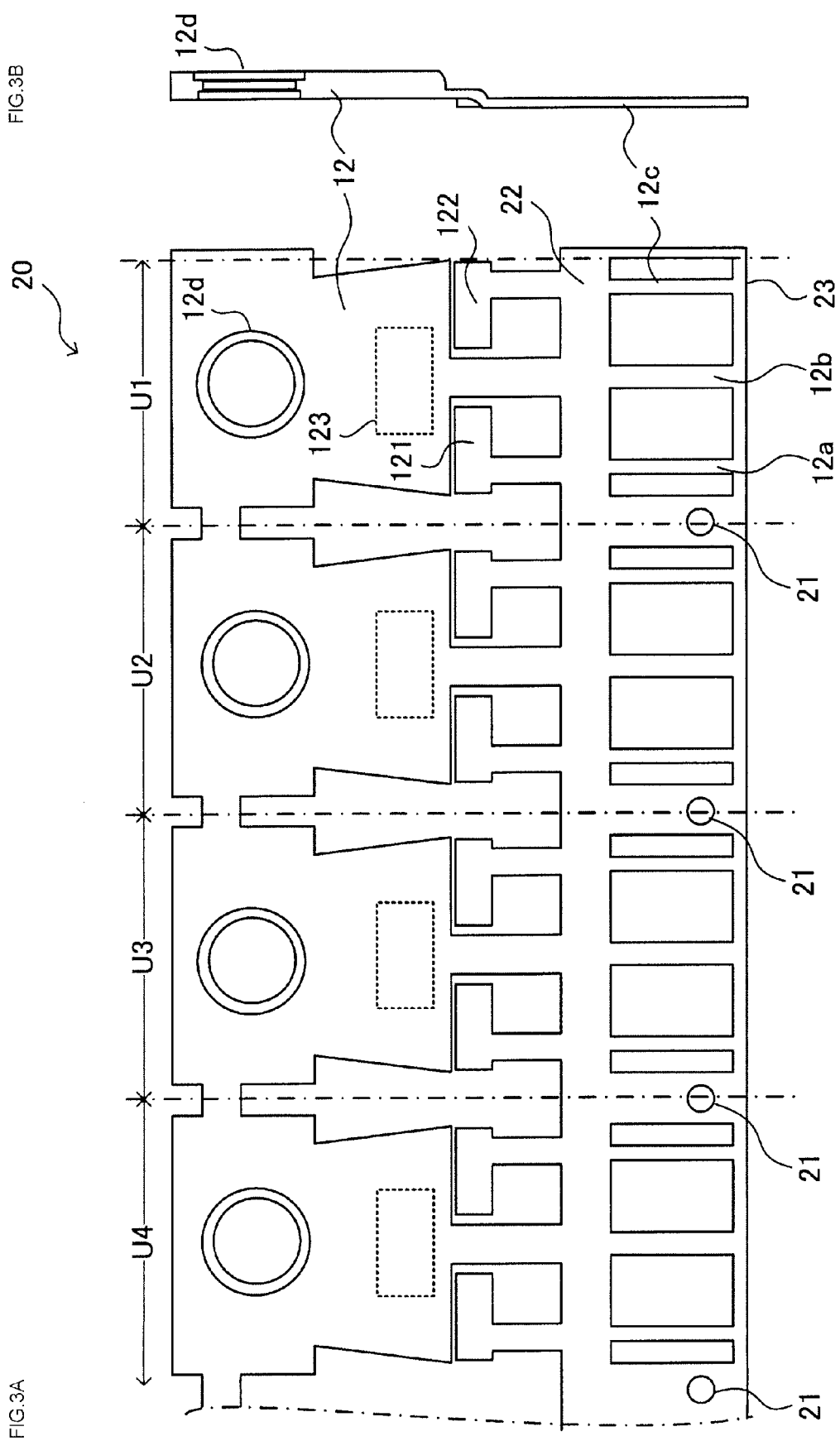

CONNECTOR AND RESIN-SEALED SEMICONDUCTOR DEVICE

RELATED APPLICATIONS

The present application is based on, and claims priority from, Japanese Application No. JP2012-003843 filed Jan. 12,2012, the disclosure of which is hereby incorporated by reference herein in its entirety.

BACKGROUND OF THE INVENTION

1. Field of the Invention

The present invention relates to a connector for electrically connecting a chip electrode of a semiconductor element and a lead constituting an external leading terminal thereof, and a resin-sealed semiconductor device using the connector. Particularly, the present invention relates to a connector and resin-sealed semiconductor device that can be used effectively even when the area of the chip electrode is extremely small.

2. Description of the Related Art

A resin-sealed semiconductor device such as a diode for use with high power has a large number of aluminum wires bonded together to configure internal wiring when connecting a chip electrode of a semiconductor element to an external leading electrode, the semiconductor element having anode potential and cathode potential applied onto the same plane of the semiconductor element.

FIG. 4 is a perspective view showing a resin-sealed semiconductor device completed by a resin sealing process.

A semiconductor device 1 is configured by mold-sealing a discrete semiconductor element using a package outer shape of a TO-3P, wherein internal wiring and a semiconductor chip are protected by a sealing resin 2. Prior to the resin sealing process, wire bonding is implemented in which the semiconductor chip is joined to a chip mounting part (die pad) and inner lead parts of external leading terminals 3 and the like are electrically connected to chip electrodes such as an anode electrode and a cathode electrode.

In order to achieve a high current rating in this type of semiconductor device 1, a large number of aluminum wires need to be bonded sequentially to the chip electrodes of the semiconductor chip mounted on a lead frame. However, an internal wiring method using wire bonding repeatedly performs a step of bonding the aluminum wires between an electrode on a chip surface and a lead of the package, requiring a considerable amount of processing time. Therefore, the number of bonding devices for connecting the aluminum wires increases as the production of semiconductor devices increases, lowering the efficiency in the production output per facility.

Japanese Patent Application Publication No. 2009-44107 discloses an invention of a terminal board circuit in which each lead leg of a diode is joined to a common terminal board. The terminal board circuit of this invention can ensure safety of its function without degrading its performance, even when the joint part of one of the lead legs has a defect.

Japanese Patent Application Publication No. 2009-267054 describes an invention of a semiconductor device that mainly has a semiconductor element, an island on which the semiconductor element is mounted, a metal connection plate for connecting the semiconductor element and a lead, and a sealing resin for integrally sealing these components. In this invention, when soldering or fixing the metal connection plate to the lead and the semiconductor element by means of a fixing material, a protruding portion that partially protrudes in a thickness direction is brought into contact with the lead and fixed in a state in which the metal connection plate is disposed in a predetermined position.

Each of these inventions described above adopts a wireless bonding method for connecting wires using the terminal board or metal connection plate. In other words, each of these inventions aims to improve the efficiency of producing a semiconductor device without connecting a large number of wires.

Japanese Patent Application Publication No. H7-30050 describes an invention of a semiconductor device in which a chip terminal (electrode) and an inner lead of a lead frame are connected with each other by a single wire. This invention describes the lead frame in which a pad is set below the surface of the lead. In this invention, a support bar is subjected to a half blanking process to have steps, and a pad surface on which the semiconductor chip is fixed and mounted is set below the inner lead. This facilitates the bonding work for connecting the chip terminal and the inner lead to each other by a single wire and achieves a reduction of the length of the bonding wire and the resin sealing thickness.

Incidentally, when providing wiring using a single connector instead of providing wiring having a plurality of wires, the size of an interface between the connector and a chip electrode needs to be close to the electrode surface area on the semiconductor chip as much as possible due to the significantly small electrode surface area. Furthermore, the cross-sectional area of the connector needs to be increased as much as possible to reduce a current resistance value of the connector in order to achieve a high current rating of a semiconductor device.

However, when forming a connector using a thick metal plate to obtain a small current resistance value, bending the metal plate makes the curved surface shape (R shape) thereof unstable. Moreover, it is difficult to configure the metal plate into the shape of the interface that conforms with the size of the chip electrode or the distance between the chip electrode and the lead when forming the curved surface (curved R) on the connector according to its plate thickness. For this reason, the joint between the chip electrode of the semiconductor element and the connector or between the lead (inner lead part) and the connector becomes insufficient, and the electrical connection between the chip electrode and the external leading terminals 3 and the like becomes insufficient, resulting in a decline of the yield and reliability of the resin-sealed semiconductor device.

SUMMARY OF THE INVENTION

The present invention was conceived in view of the circumstances described above, and an object thereof is to provide a connector capable of reliably forming a connection surface corresponding to a narrow electrode surface area.

Another object of the present invention is to provide a low-cost resin-sealed semiconductor device capable of performing high current processing.

In order to solve the problems described above, the present invention provides a connector for electrically connecting a chip electrode of a semiconductor element to a lead constituting an external leading terminal of the chip electrode. The connector has a first connecting part having an interface joined to the chip electrode; a second connecting part having an interface joined to a base end part of the lead; and a plate-like coupling part for connecting the first connecting part and the second connecting part to each other, with this coupling part being provided with a step formed, by a half blanking process, on the interface of the first connecting part in a direction away from the chip electrode.

The present invention provides a resin-sealed semiconductor device that has a semiconductor element, a lead frame having a chip mounting part on which the semiconductor element is mounted and a plurality of external leading terminals, and the abovementioned connector for electrically connecting the chip electrode disposed on a main surface of the semiconductor element to lead base end parts constituting the external leading terminals. The chip mounting part, the semiconductor element, and the connector are integrally resin-sealed.

According to the present invention, when connecting a semiconductor chip and an external leading electrode to each other, a connection section corresponding to the electrode surface area of the semiconductor chip can be formed accurately by applying a connector on which a half blanking step formation is performed. In addition, a resin-sealed semiconductor device having a favorable connection between the semiconductor chip and the lead frame can be realized by enhancing the accuracy of forming the connection section of the connector.

BRIEF DESCRIPTION OF THE DRAWINGS

FIGS. 1A and 1B show principal parts of a resin-sealed semiconductor device according to an embodiment of the present invention, wherein FIG. 1A is a plan view and FIG. 1B is a cross-sectional view;

FIGS. 2A and 2B show an enlargement of two connectors used in the semiconductor device shown in FIGS. 1A and 1B, wherein FIG. 2A is a plan view and FIG. 2B is a cross-sectional view;

FIGS. 3A and 3B show a lead frame used in producing the semiconductor device shown in FIGS. 1A and 1B, wherein FIG. 3A is a plan view and FIG. 3B is a side view.

DESCRIPTION OF THE PREFERRED EMBODIMENTS

Figure 1A:
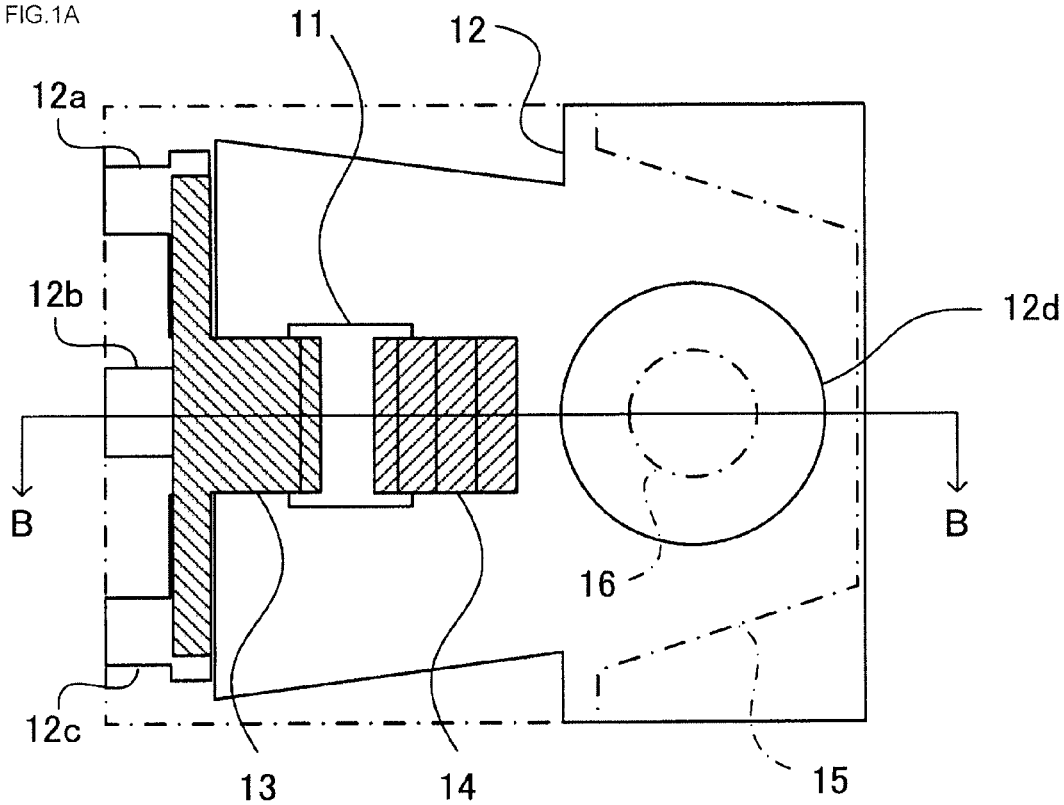
Figure 1B:
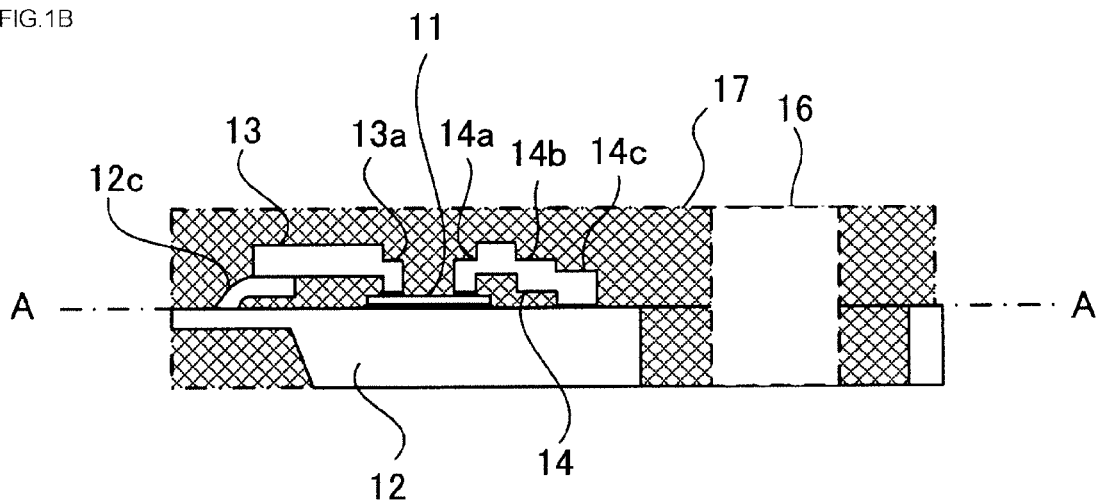
Figure 4:
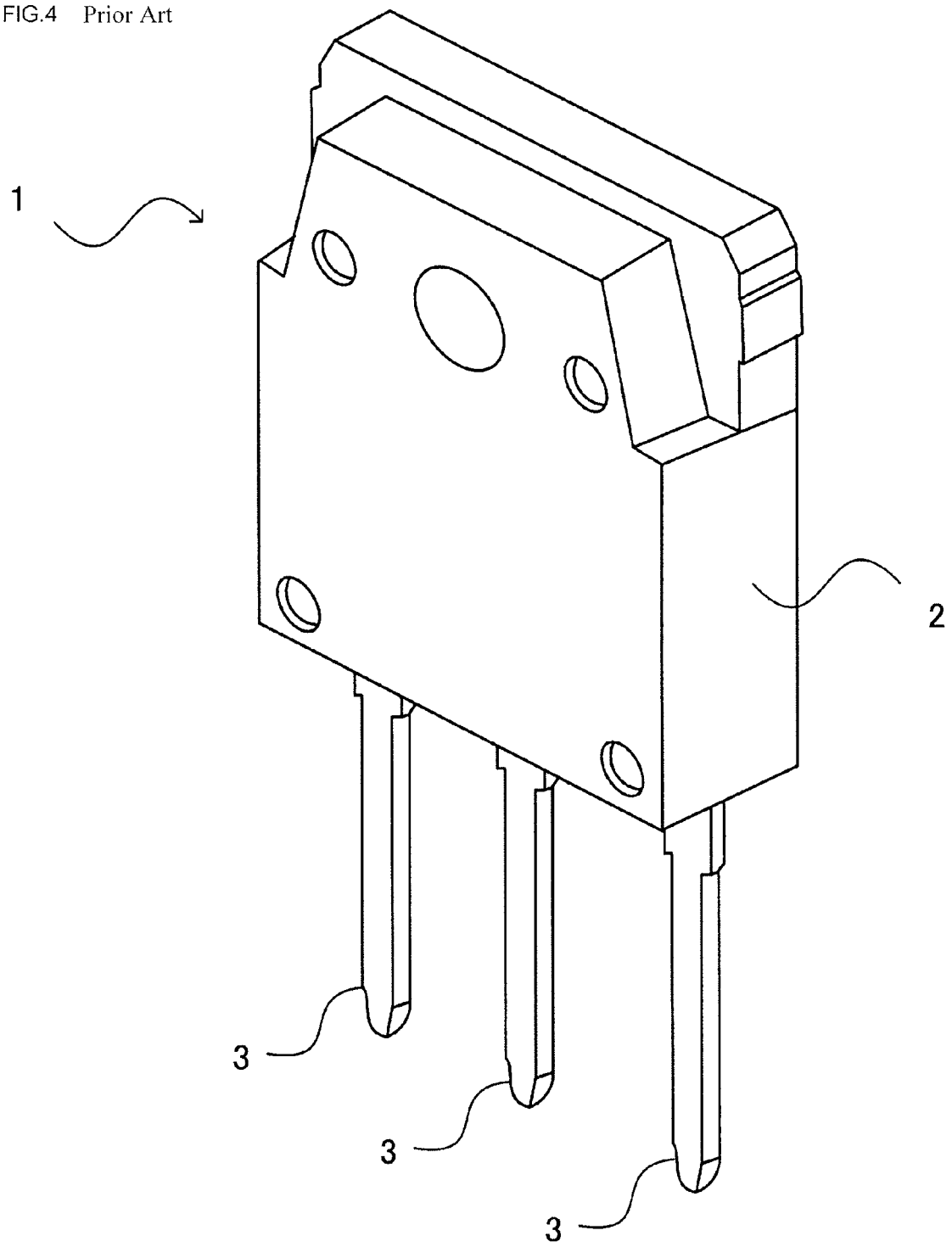
FIG. 4 is a perspective view showing a resin-sealed semiconductor device completed by a resin sealing process.

An embodiment of the present invention is described hereinafter with reference to the drawings. FIGS. 1A and 1B show principal parts of a resin-sealed semiconductor device according to the embodiment of the present invention, wherein FIG. 1A is a plan view and FIG. 1B is a cross-sectional view.

A semiconductor element 11 is mounted on a chip mounting part 12 of a lead frame, which is described hereinafter, to configure a discrete semiconductor device. The lead frame is provided with three leads (inner lead parts) 12a to 12c constituting external leading terminals. Of these three leads, the leads 12a, 12c are disposed as the external leading terminals that are physically away from the chip mounting part 12. The lead 12b between the leads 12a, 12c is configured integrally as the external leading terminal serving as a base end part of the chip mounting part 12. In this example, a diode is used to describe the semiconductor element 11. Electrodes (anode electrode, cathode electrode) are formed on a main surface of the semiconductor element 11 that is on the other side of a surface of the semiconductor element 11 to which the chip mounting part 12 is joined.

A connector 13 is provided for electrically connecting the leads 12a, 12c and one of the chip electrodes of the semiconductor element 11 (the cathode electrode) to each other by means of soldering or using other joining materials. The connector 13 is shaped into a T-shape as viewed from above, as shown in FIG. 1A. The connector 13 is so shaped as to connect one of the chip electrodes of the semiconductor element 11 to the leads 12a, 12c. The connector 13 may have any desired shape when connecting one of the chip electrodes to either one of the leads 12a, 12c.

As shown in the cross-sectional view of the connector 13 in FIG. 1B, a step 13a is formed on an interface between the connector 13 and the cathode electrode of the semiconductor element 11 by a half blanking process, in a direction away from the cathode electrode.

Another connector 14 is provided for electrically connecting the other chip electrode of the semiconductor element (the anode electrode) and the lead 12b to each other. The connector 14 is shaped into a rectangular shape as viewed from above, as shown in FIG. 1A. As shown in the cross-sectional view of the connector 14 in FIG. 1B, one step 14a is formed on an interface between the connector 14 and the cathode electrode of the semiconductor element 11 by the half blanking process, in a direction away from the anode electrode. Similarly, two steps 14b, 14c are formed on an interface between the connector 14 and the chip mounting part 12 by the half blanking process.

Further, a fixing screw hole 12d for fixing the semiconductor device to a radiator is formed on the chip mounting part 12 of the lead frame. Note that in FIG. 1A, a resin-sealed region 15 is shown with a dashed line. The hatched area in FIG. 1B, excluding a screw hole part 16, shows a metal mold region into which a sealing resin 17 is injected.

Unlike the internal wiring method using a large number of aluminum wires, the use of the connectors 13, 14 described as internal wiring materials can eliminate the need for performing a wire bonding step and consequently enhance the efficiency of producing the resin-sealed semiconductor device. Note that the same materials that are normally applied to any discrete semiconductor device can be used as the lead frame, the solder joining material, and the resin-sealing material.

The shapes and the like of the two connectors 13, 14 are further described hereinafter.

FIGS. 2A and 2B show an enlargement of the two connectors used in the semiconductor device shown in FIGS. 1A and 1B, wherein FIG. 2A is a plan view and FIG. 2B is a cross-sectional view.

A plate-like coupling part (plate-shape coupling part) 13b corresponding to the vertical rod part of the T-shape of the connector 13 is configured to have a uniform width close to the length of one of the chip electrode of the semiconductor element 11 (the cathode electrode 11a) in a Y-axis direction. At a lower end part of the vertical rod part of the T-shape of the connector 13, the step 13a, obtained by the half blanking process to have approximately ½ the plate thickness of the connector 13, forms a connection surface that is connected to the cathode electrode 11a, the connection surface being slightly narrower than the length of the cathode 11a in a X-axis direction. In addition, joining surfaces that are joined to the leads 12a, 12c of the lead frame shown in FIGS. 1A and 1B are formed at tip end parts of arm sections 131, 132 of the T-shape of the connector 13.

The other connector 14 is shaped into a rectangular shape as viewed from above, and has the three steps 14a to 14c that are formed by the half blanking process to have approximately ½ the plate thickness of the connector 14. Of these three steps, the first step 14a forms a connection surface that is connected to the other chip electrode of the semiconductor element 11 (the anode electrode 11b). The second and third steps 14b, 14c form connection surfaces that are connected to the chip mounting part 12 serving as a base end part of the lead 12b. In other words, when the plate thickness of a metal mold plate configuring the connector 14 is 0.8 mm, the two steps 14b, 14c have approximately ½ the thickness of the connector 14 (0.4 mm), thereby obtaining a step with a total thickness of 0.8 mm.

The length of each of the chip electrodes 11a, 11b formed on the semiconductor element 11 is 0.7 mm in the X-axis direction and 4.1 mm in the Y-direction. Thus, the joining surface between each of the connectors 13, 14 and each of the narrow chip electrodes 11a, 11b is formed by configuring the step 13a and the steps 14a to 14c by means of the half blanking process.

The connection surfaces of the connectors 13, 14 may be formed into sizes conforming to the areas of the chip electrodes 11a, 11b of the semiconductor element 11. Therefore, the shapes of the other sections of the connectors 13, 14 are not limited to the examples described above.

Even in the semiconductor element 11 with a high current rating, the joining surfaces of the connectors 13, 14 can be reliably formed into sizes conforming to the areas of the chip electrodes 11a, 11b.

Note that, when performing the half blanking process on the connectors 13, 14 in the plate thickness direction, it is preferred that the steps be formed to have a thickness equal to or less than half the plate thickness of the metal plates, not only when the areas of the chip electrodes 11a, 11b of the semiconductor element 11 are small but also when reducing electrical resistance of the connectors 13, 14. Regarding the steps 13a and 14a to 14c, a predetermined number of steps may be formed in accordance with the difference in height between the chip electrodes 11a, 11b, the leads 12a, 12b, and the chip mounting part 12.

The half blanking process for forming the steps in the plate thickness direction can be performed as a press work using a die and punch, wherein the plate can be half-blanked substantially perpendicularly in the plate thickness direction to have approximately half the plate thickness. In so doing, because the steps formed vertically are continuous and do not cut the rest of the plate thickness, the connection sections corresponding to the significantly narrow electrode surface areas of the semiconductor chip can be formed. Therefore, by using the plate thick enough to be subjected to the half blanking process, the cross-sectional area of most sections besides the half-blanked sections can be increased. Consequently, the resultant connectors can deal with high current.

FIGS. 3A and 3B show a lead frame used in producing the semiconductor device shown in FIGS. 1A and 1B, wherein FIG. 3A is a plan view and FIG. 3B is a side view.

A lead frame 20 is obtained by performing a press work on a single metal plate. On the lead frame 20, a large number of units U1, U2 and the like are punched. The chip mounting part 12 and the leads 12a to 12c are integrally configured in each of the units U1, U2 and the like. A positioning hole 21 for determining the position for mounting the semiconductor chip is formed at each connection between the units U1, U2 and the like. The leads 12a, 12c are connected to the lead 12b continuing to the chip mounting part 12, by a dam bar 22 penetrating through each of the units U1, U2 and the like.

In a step of assembling the resin-sealed semiconductor device, after mounting the semiconductor chip on each of the units U1, U2 and the like, base end parts 121, 122 of the leads 12a, 12c are electrically connected to the chip electrode (the cathode electrode) of the semiconductor chip fixed to a chip fixing region 123, by the connector 13, and the chip mounting part 12 is electrically connected to the other chip electrode (the anode electrode) by the connector 14. Finally, in each of the units U1, U2 and the like, the chip mounting part 12, the semiconductor chip, and the connector are integrally resin-sealed. The dam bar 22 and a side rail 23 are cut and divided into individual elements.

In this embodiment the cathode electrode is connected to the two leads 12a, 12c; however, the configuration of the connection therebetween is not limited thereto. For instance, the anode electrode and the cathode electrode may be connected to the lead 12a and the lead 12b respectively, and the lead 12c may be cut. Depending on the position where the chip electrode of the semiconductor chip is mounted, the shapes of the connectors 13, 14 can be changed, and then the cathode electrode and the anode electrode can be connected to one of the outer leads and the other two leads.

In addition, the semiconductor element that is mounted on the lead frame 20 may be a component other than a diode having the abovementioned two electrodes. The semiconductor element, therefore, can be applied to a discrete semiconductor device such as a MOSFET (IGBT). The present invention has described an example of a horizontal semiconductor element, but the present invention can be applied to a vertical device that has an electrode on a rear surface of a semiconductor chip thereof.

What is claimed is:

1. A connector for electrically connecting a chip electrode, arranged on one main surface of a semiconductor element, to a lead constituting an external leading terminal of the chip electrode, comprising:
    a plate shape portion including a first main surface and a second main surface;
    a first interface arranged on the first main surface joined to the chip electrode;
    a second interface arranged on the first main surface joined to a base end part of the lead; and
    a first step formed between the first interface and an entire surface of the first main surface except for the first interface and extending in a direction perpendicular to a direction from the first interface toward the second interface such that the entire surface of the first main surface except for the first interface is arranged away from a surface of the chip electrode,
    wherein a height between the surface of the chip electrode and the first main surface except for the first interface is equal to or less than a half of a thickness of the connector.

2. A connector for electrically connecting a chip electrode, arranged on one main surface of a semiconductor element, to a lead constituting an external leading terminal of the chip electrode, comprising:
    a plate shape portion including a first main surface and a second main surface;
    a first interface arranged on the first main surface joined to the chip electrode;
    a second interface arranged on the first main surface joined to a base end part of the lead; and
    a plurality of steps formed on the first main surface except for the first interface and the second interface, and extending in a direction perpendicular to a direction from the first interface toward the second interface such that the first main surface except for the first interface and the second interface is arranged away from a surface of the chip electrode or the base end part of the lead,
    wherein a height between the surface of the chip electrode or the base end part of the lead, and the first main surface except for the first interface and the second interface is equal to or less than a half of a thickness of the connector.

3. A resin-sealed semiconductor device, comprising:
the semiconductor element;
a lead frame including a chip mounting part mounting the semiconductor element thereon, and a plurality of external leading terminals; and
the connector according to claim 1 for electrically connecting the chip electrode, disposed on the one main surface of the semiconductor element, to lead base end parts constituting the plurality of external leading terminals, wherein the chip mounting part, the semiconductor element, and the connector are integrally resin-sealed.

4. The connector according to claim 1, wherein the plate portion is formed in a T-shape in a plan view thereof, and the second interface connects a plurality of external leading terminals.

5. The connector according to claim 2, wherein the plurality of the steps includes:
a first step formed between the first interface and the first main surface adjacent to the first interface and extending in the direction perpendicular to the direction from the first interface toward the second interface such that the first main surface adjacent to the first interface is arranged away from the surface of the chip electrode,
a second step formed between the second interface and the first main surface adjacent to the second interface and extending in the direction perpendicular to the direction from the first interface toward the second interface such that the first main surface adjacent to the second interface is arranged away from the base end part of the lead, and
a third step formed between the first main surface adjacent to the first interface and the first main surface adjacent to the second interface, and extending in the direction perpendicular to the direction from the first interface toward the second interface such that the first main surface adjacent to the first interface is connected to the first main surface adjacent to the second interface.

6. The connector according to claim 1, further comprising a second step formed at a position corresponding to the first step on the second main surface and having a height same to that of the first step.

7. The connector according to claim 5, further comprising another plurality of steps formed at positions corresponding to the plurality of steps on the second main surface to have heights same to those of the plurality of steps.

8. The connector according to claim 7, wherein the another plurality of steps includes:
a fourth step formed at a position corresponding to the first step on the second main surface and having a height same to that of the first step,
a fifth step formed at a position corresponding to the second step on the second main surface and having a height same to that of the second step, and
a sixth step formed at a position corresponding to the third step on the second main surface and having a height same to that of the third step.

9. The connector according to claim 2, wherein the second interface is positioned same to another main surface of the semiconductor element.

10. A resin-sealed semiconductor device, comprising:
a semiconductor element;
a lead frame including a chip mounting part mounting the semiconductor element thereon, and a plurality of external leading terminals;
a connector for electrically connecting a chip electrode, disposed on one main surface of the semiconductor element, to lead base end parts constituting the plurality of external leading terminals, the connector including:
a plate shape portion including a first main surface and a second main surface,
a first interface arranged on the first main surface joined to the chip electrode,
a second interface arranged on the first main surface joined to the lead base end parts constituting the plurality of external leading terminals, and
a first step formed between the first interface and the first main surface adjacent to the first interface, the first main surface being arranged away from a surface of the chip electrode; and
another connector arranged apart from the connector on the semiconductor element, the another connector including:
another plate shape portion having a third main surface, a fourth main surface facing the third main surface,
a third interface arranged on the third main surface joined to the chip electrode, and
a fourth interface arranged on the third main surface joined to the chip mounting part,
wherein a height between the surface of the chip electrode and the first main surface is equal to or less than a half of a thickness of the connector,
the chip mounting part, the semiconductor element, and the connector are integrally resin-sealed, and
the connector is arranged to one side portion of the semiconductor element and extends in a direction toward the plurality of external leading terminals, and the another connector is arranged to another side portion of the semiconductor element and extends in a direction opposite to the connector.

11. The connector according to claim 10, wherein the connector includes a second step formed at a position corresponding to the first step on the second main surface and having a height same to that of the first step; and
the another connector includes a plurality of steps formed on the third main surface between the third interface and the fourth interface such that a height of the third main surface from the chip mounting part becomes high in a direction from the fourth interface to the third interface, and another plurality of steps formed at positions corresponding to the plurality of steps on the fourth main surface such that a height of the fourth main surface from the chip mounting part becomes high in the direction from the fourth interface to the third interface.

12. The connector according to claim 11, wherein the plate portion of the connector includes a plate-shape coupling part and a pair of arm sections extending outwardly from the coupling part in directions opposite each other to form a T-shape in a plan view thereof, the coupling part having a width, in a direction perpendicular to an extending direction of the coupling part, same as that of the another connector, and each of the pair of arm sections has the second interface portion and the coupling part has the first interface portion; and
the plurality of external leading terminals of the lead frame includes three lead base end parts, one of the three lead base end parts being integrally formed with the chip mounting part and two of the three lead base end parts other than the one of the three lead base end parts being physically separated from the chip mounting part, and the second interface connects each of the two of the three lead base end parts through each of the pair of arm sections and the fourth interface connects the one of the three inner lead through the chip mounting part.

13. The connector according to claim 12, wherein the plurality of steps of the another connector includes a third step formed between the third interface and the third main surface apart from the third interface, and a fourth step formed between the fourth interface and the third main surface apart from the fourth interface; and the another plurality of steps of the another connector includes a fifth step formed at a position corresponding to the third step on the fourth main surface, a sixth step formed at a position corresponding to the fourth step on the four main surface, and a seventh step formed between the fifth step and the sixth step on the fourth main surface; and the third main surface on the third step is positioned higher than that of the fourth step from the chip mounting part, and the fourth main surface between the fifth step and the seventh step is positioned higher than other portion of the fourth main surface from the chip mounting part.

14. The connector according to claim 5, wherein the first interface is positioned higher than the second interface such that the first step is arranged higher than the second step.

* * * * *

UNITED STATES PATENT AND TRADEMARK OFFICE
CERTIFICATE OF CORRECTION

PATENT NO.        : 9,252,086 B2
APPLICATION NO.   : 13/706699
DATED             : February 2, 2016
INVENTOR(S)       : Atsushi Maruyama It is certified that error appears in the above-identified patent and that said Letters Patent is hereby corrected as shown below:

In the specification

Please change column 4, line 13, from "… semiconductor element (the" to --… semiconductor element 11 (the--.

Signed and Sealed this
Tenth Day of May, 2016

Michelle K. Lee
*Director of the United States Patent and Trademark Office*